United States Patent [19]

Yamazaki

[11] Patent Number: 5,100,863

[45] Date of Patent: Mar. 31, 1992

[54] SUPERCONDUCTING CERAMICS MANUFACTURING METHOD

[75] Inventor: Shumpei Yamazaki, Tokyo, Japan

[73] Assignee: Semiconductor Energy Laboratory Co., Ltd., Kanagawa, Japan

[21] Appl. No.: 172,231

[22] Filed: Mar. 23, 1988

[30] Foreign Application Priority Data

Mar. 23, 1987 [JP] Japan .................................. 62-69449

[51] Int. Cl.$^5$ .............................................. H01B 12/00
[52] U.S. Cl. ........................................... 505/1; 427/62; 427/63; 204/192.24; 505/730; 505/731; 505/732; 505/739; 505/741; 505/816; 505/818; 505/819
[58] Field of Search ..................... 264/61; 427/38, 62, 427/63; 505/731, 730, 732, 739, 741, 1, 816, 818, 819; 204/192.24

[56] References Cited

U.S. PATENT DOCUMENTS 4,920,094 4/1990 Nogawa et al. ..................... 505/731

OTHER PUBLICATIONS

Brodsky et al., High Temperature Superconductors, Symposium Nov. 30–Dec. 4, 1987, Boston, Mass., Materials Research Society, pp. 297–301.

Primary Examiner—James Derrington
Attorney, Agent, or Firm—Sixbey, Friedman, Leedom & Ferguson

[57] ABSTRACT

An improved method of manufacturing superconducting ceramics in the form of a thin film are described. The thin film is first formed of a superimposed structure composed of three films which contain a rare earth metal, an alkaline metal and copper respectively. Then the superimposed thin film is fired to convert to superconducting film.

13 Claims, 2 Drawing Sheets $Bi_2Sr_3Ca_2Cu_2O_x$

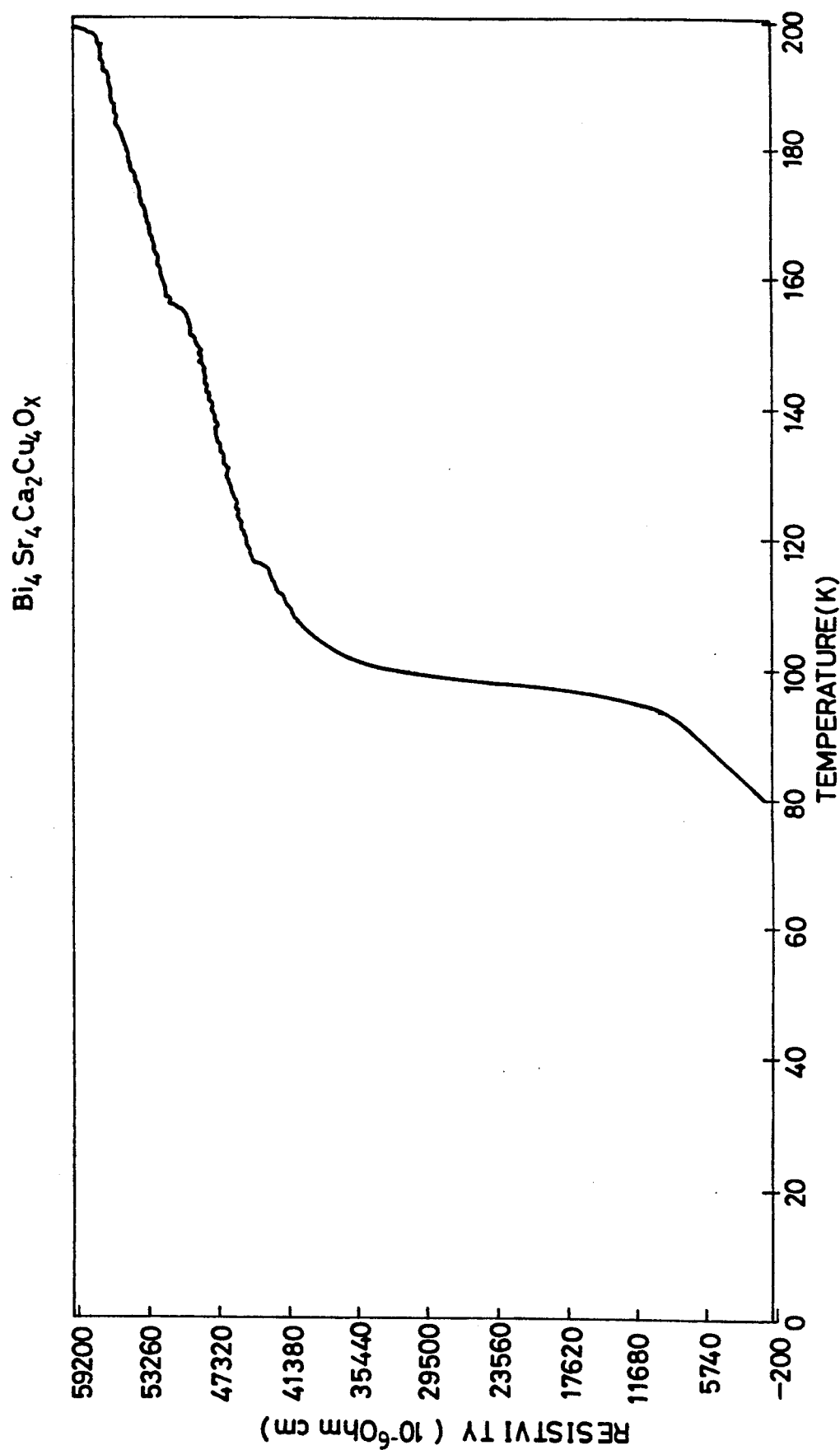

SUPERCONDUCTING CERAMICS MANUFACTURING METHOD

BACKGROUND OF THE INVENTION

This invention relates to superconducting ceramics manufacturing method

The prior art has proposed the use of metal such as mercury and lead, intermetallics such as NbNd, $Nb_3Ge$ and $Nb_3Ga$, and ternary materials such as $Nb_3(Al_{0.8}Ge_{0.2})$ as superconductors. Another type of superconducting material, superconductive bariumlead-bismuth oxides is described in U.S. Pat. No. 3,932,315. However, only three-dimensional electron conduction takes place in such conventional superconducting materials, and the critical transition temperature Tc of such a conventional superconducting material can not therefore exceed 25° K.

In recent years, superconducting ceramics have attracted widespread interest. A new material was first reported by researchers at the Zurich laboratory of IBM Corp. as Ba-La-Cu-0-type high tem superconducting oxides. Also, La-Sr-Cu(II)-0-type superconducting oxides have been proposed. This type of superconducting material appears to form a quasi-molecular crystalline structure whose unit cell is constructed with one layer in which electrons have essentially one dimensional motion.

SUMMARY OF THE INVENTION

It is therefore an object of the invention to provide an improved method of manufacturing superconducting ceramics including the $K_2NiF_4$ type structure.

In accordance with the present invention, the metals or metallic compounds prepared separately for respective metals to conform the composition of superconducting ceramics are formed by vacuum evaporation deposition, sputtering, printing, coating or vapor phase method into thin films which are superimposed one on another into a multi-layered structure. When the metal itself is employed for each metallic constituent, the thickness is chosen about 300-5000Å, e.g. 500Å. Then, the multi-layered structure is fired to endow the same with a superconductivity, in which a layered structure associated with four copper atoms is constructed.

More generally speaking, each thin film of the multi-layered structure corresponds not necessarily only to one metallic constituent. For example, when an rare earth element, an alkaline earth element and copper are the metallic constituents of superconducting ceramic, a couple of tablets can be used as targets, e.g. one containing the rare earth element and the alkaline element and the other containing copper, one containing the rare earth element and copper and the other containing the alkaline earth element and copper, and the other possible combinations.

BRIEF DESCRIPTION OF DRAWINGS

FIGS. 1 and 2 are graphical diagrams showing the relationship between the resistivity and the temperature of the superconducting ceramics.

DETAILED DESCRIPTION OF THE PREFERRED EMBODIMENTS

Figure 1:
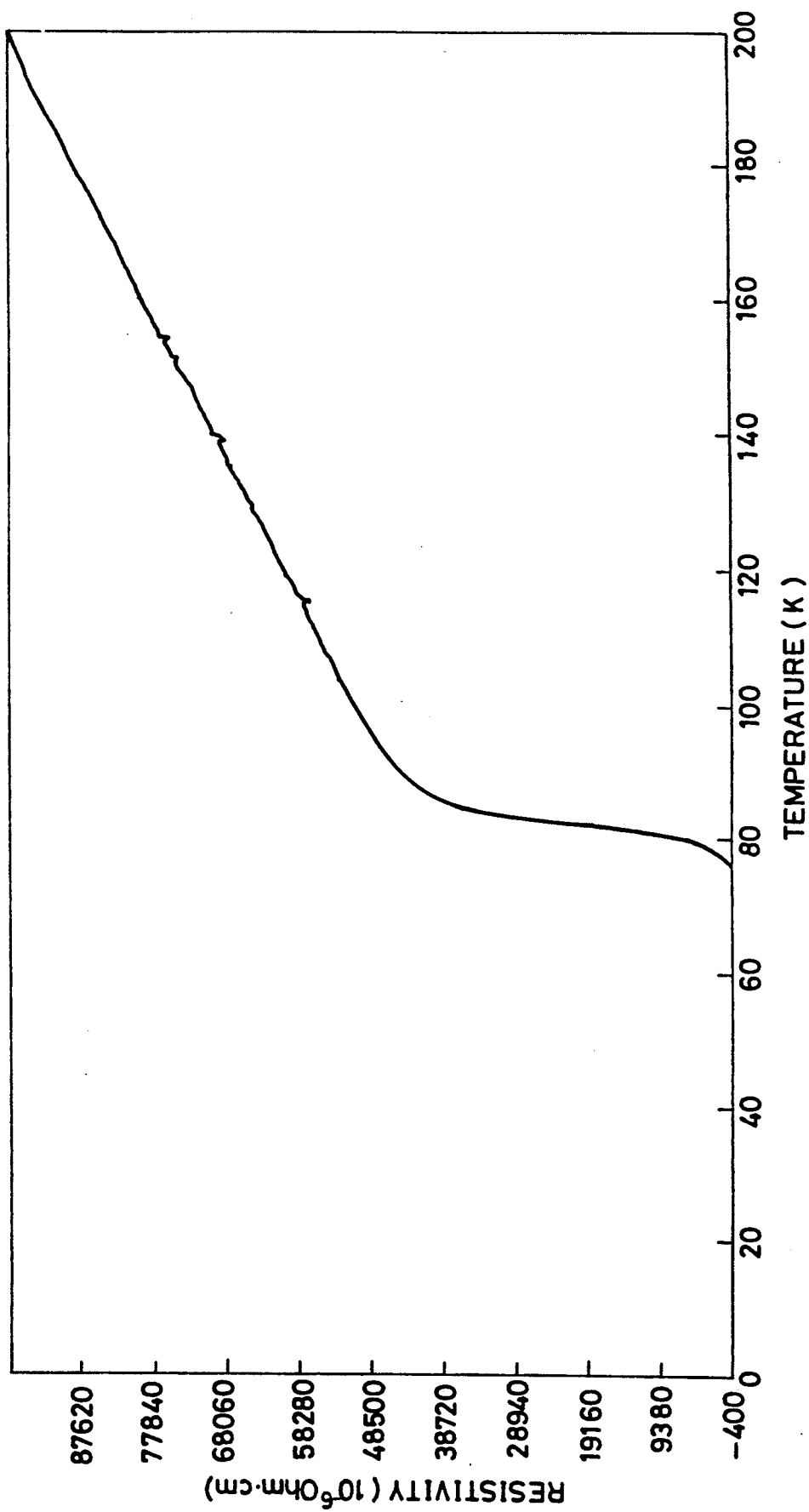

Described hereinafter are a number of examples illustrating the manufacture by a method according to the present invention of superconducting ceramics conforming to the stoichiometric formula:

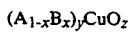

wherein
 $x = 0.01-0.3$;
 $y = 1.0-2.2$;
 $z = 2.0-4.5$, and

A stand for one or more elements selected from rare earth elements and B stand for two or more elements selected among from alkali earth metals. One example is $YBa_2Cu_3O_{6-8}$.

According to "Chambers Science and Technology Dictionary" distributed by W & A Chambers Ltd., rare earth elements are the lanthanide elements 57 to 71, plus scandium (21) and yttrium (39). Namely, La, Ce, Pr, Nb, Pm, Sm, Eu, Gd, Tb, Dy, Ho, Er, Tm, Yb, Lu, Sc (scandium) and Y (yttrium). Alkali earth metals are elements belonging to Group 2A of the periodic table. Namely, Be, Mg, Ca, Sr, Ba, and Ra.

In accordance with the present invention, "A", "B" and copper are layered with respective thin films as metals (simple substance) or oxides by vapor deposition, sputtering, printing, coating or vapor phase method, and then oxidized by firing to form a superconducting thin film. Alternatively, when formed by sputtering, two tablets including different metallic constituents can be employed as targets.

EXAMPLE 1

$Y_2O_3$, $BaCO_3$, and $CuO$ all in the form of fine powder having a purity of 99.95% or higher were prepared to make superconducting ceramics conforming to the above formula with $x=0.15$; $y=1.8$; $z=2.0-5.0$ and with A being Y and B being barium. The experiment was repeated with the value of x changing from 0.01 to 0.3, i.e. 0.05, 0.1, 0.15 and 0,2. These materials were packed into respective capsules and pressed in the form of tablets of 10 mm diameter and 3 mm thickness respectively under a pressure of 3 $Kg/cm^2$, followed by firing. Then, thin films each being 300-5000 Å thick were formed one on another by sputtering with the three tablets switching in turn as a target. The multi-layered structure was fired for 8 hours at 500-1200° C., for example 70° C., in oxidizing surroundings, for example ambient air. After this firing, the total thickness was measured to be 500 Å-1 micron, e.g. 200Å. Finally, the tablets were reduced by heating for 3-30 hours, e.g., for 20 hours, at 600-1200° C., e.g., at 800° C. in an oxygen/argon mixture containing a minor of oxygen.

The relationship between the temperature and the resistivity of this material in tablet form was investigated. It was obserbed that the phase transition to superconducting state began as the temperature descended below 38° K. (Tc onset temperature) and the disappearance of resistance was observed at 28° K. (Tco).

EXAMPLE 2:

The powder mixture of yttrium metal and ytterbium metal (Y:Yb=1:1) was employed as "A" of the formula, and barrium metal as "B". Both were formed on a substrate by vacuum evaporation deposition into thin films respectively. A copper thin film was formed the two thin films by vapor deposition in the same manner. Other condition was same as that of Example 1.

The relationship between the temperature and the resistivity of this film was investigated. The phase transition to superconductivity was observed when the temperature descended below 39° K. (Tc onset temperature) and the disappearance of resistance was observed at 27K.° (Tco).

This process can be repeated several times on the superconducting film formed by the preceding process. The thickness increases by 0.2–1.0 micron per process. However, in accordance with experimental, Tco was elevated by 5–20° K. per process.

EXAMPLE 3

Yttrium(Y2O3) was employed as "A" of the formula, and barrium (BaCO3) as "B", while copper was introduced as metal. They are all prepared as liquid compound such as alkylenes thereof and diluted with a thinner respectively. A surface was coated with three thin films each being 0.03–0.5 micron, e.g. 0.3 micron by spinner using the respective thinned liquids. Then, the three films were fired in the same way as performed in Example 1. Tc onset and Tco were measured to be 45° K. and 38° K. respectively.

The following formulae are variations of above general formulae of superconducting ceramic materials which are produced according to the present invention.

$$(A_{1-x}B_x)_{y'}Cu_2O_{z'},$$

wherein
$y' = 2.6\text{-}4.4$;
$z' = 4.0\text{-}8.0$, for example
$y' = 3, z = 7$ or
$y' = 2, z' = 6$.

$$(A_{1-x}B_x)_{y'}Cu_6O_{z'},$$

wherein
$y' = 6, z' = 14$.

The superconducting ceramic material for use in accordance with the present invention also may be prepared consistent with the stoichiometric formula $(A_{1-x}B_x)_y Cu_z O_w$, where A is one or more elements selected from Group Vb of the Periodic Table such as Bi, Sb and As. B is one or more elements selected from one or more alkaline earth elements, and $x = 0$ to 1 $y = 2\text{-}.0\text{-}4.0$; $z = 1.0\text{-}4.0$, and $w = 4.0$ to $10.0$, preferably $x = 0.01$ to $0.3$ $y = 2.5$ to $3.5$, $z = 1.5$ to $3.5$, and $w = 6.0$ to $8.0$. Examples of this formula are $BiSrCaCu_2O_x$ and $Bi_4Sr_3Ca_3Cu_4O_x$. Tc onset and Tco of samples confirmed consistent with the formula $Bi_4Sr_yCa_3Cu_4O_x$ (y is around 1.5) were measured to be 40–60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The data showing high critical temperatures are illustrated in FIGS. 1 and 2. The number x showing the oxygen proportion is 6–10, e.g. around 8.1. In this description, Group Vb is directed to the typical element on a column of the Periodic Table while Group IIIa is directed to the transition element on a column of the periodic Table.

While several embodiments have been specifically described, it is to be appreciated that the present invention is not limited to the particular examples described and that modifications and variations can be made without departure from the scope of the invention as defined by the appended claims. For example, although the description is not directed to the pattern of the superconducting thin films, the patterning of superconducting ceramic thin films can be performed, e.g. by printing method suitably.

I claim:

1. A method of forming a superconducting ceramic comprising:

forming by vacuum evaporation deposition, sputtering, printing, coating or vapor phase method at least one layer on a surface to be coated, said layer consisting of a plurality of superimposed thin films, each of which contains a different metallic constituent of a superconducting ceramic material wherein said superconducting ceramic material is consistent with the stoichiometric formula:

$$((A_{1-x}B_x)_y CuO_z$$

wherein
$x = 0.01\text{-}0.03$;
$y = 1.0\text{-}2.2$;
$z = 2.0\text{-}4.5$, and

A stands for one or more elements selected from rare earth elements and B stands for one or more elements selected from alkali earth metals; and firing said layer and transforming same to a superconducting thin film of said superconducting ceramic material.

2. The method of claim 1 wherein said thin films comprising a first film containing a rare earth element, a second film containing an alkaline earth element and a third film containing copper.

3. The method of claim 2 wherein said forming process is performed sputtering targets containing the metallic constituents, said targets being switched in turn to produce said superimposed films.

4. The method of claim 3 wherein at least one of said targets is made of the metal.

5. The method of claim 3 wherein at least one of said targets is made of the oxide of the metal.

6. The method of claim 1 wherein said thin films are formed by coating.

7. The method of claim 6 wherein said thin films formed by dispersing the oxides or simple substance of metallic constituents into a liquid to produce solutions or slurries, coating said solutions or slurries superimposedly on said surface.

8. The method of claim 2 wherein aid first, second and third films are formed one on another only one time.

9. The method of claim 2 wherein said first, second and third films are formed one on another repeatedly in turns.

10. The method of claim 1 wherein the thickness of said thin films is 300 to 500Å.

11. A method of forming a superconducting ceramic comprising:

forming by vacuum evaporation deposition, sputtering, printing, coating or vapor phase method at least one layer on a surface to be coated, said layer consisting of a plurality of superimposed thin films, each of which contains a different metallic constituent of a superconducting ceramic material wherein said superconducting ceramic material is consistent with the stoichiometric formula:

$$(A_{1-x}B_x)_yCu_zO_w$$

wherein
x=0 to 1;
y=2-4;
z=1-4;
w=4-10; and
A stands for one or more elements selected from the group Vb elements such as Bi, Sb and As and B stands for one or more elements selected from the alkali earth elements; and
firing said layer and transforming same to a superconducting thin film of said superconducting ceramic material.

12. The method of claim 11 wherein said superconducting ceramic is consistent with $BiSrCaCu_2O_x$, $Bi_4Sr_3Ca_3Cu_4O_x$, $Bi_4Sr_yCa_3Cu_4O_x$ (y is around 1.5), $Bi_rSr_4Ca_2Cu_4O_x$ or $Bi_2Sr_3Ca_2Cu_2O_x$.

13. A method of forming a superconducting film comprising:
forming by vacuum evaporation deposition, sputtering, printing, coating or vapor phase method at least one layer on a surface to be coated, said layer consisting of a plurality of superimposed thin films, each of which contains a different metallic constituent of a superconducting ceramic material, wherein said superconducting ceramic material is consistent with the stoichiometric formula:

$$Y_{a_2}Cu_3O_{6-8};$$

thermal annealing said layer and transforming same to a superconducting thin film of said superconducting ceramic material.

* * * * *